United States Patent
Gushiken et al.

(10) Patent No.: US 9,805,915 B2
(45) Date of Patent: Oct. 31, 2017

(54) PLASMA PROCESSING APPARATUS

(75) Inventors: Masaharu Gushiken, Hikari (JP); Megumu Saitou, Shunan (JP); Ryoji Nishio, Kudamatsu (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 1187 days.

(21) Appl. No.: 13/020,991

(22) Filed: Feb. 4, 2011

(65) Prior Publication Data

US 2012/0145322 A1 Jun. 14, 2012

(30) Foreign Application Priority Data

Dec. 13, 2010 (JP) .................................. 2010-276521

(51) Int. Cl.
*H01J 37/32* (2006.01)

(52) U.S. Cl.
CPC ...... *H01J 37/321* (2013.01); *H01J 37/32174* (2013.01); *H01J 37/32183* (2013.01); *H01J 37/32651* (2013.01)

(58) Field of Classification Search
CPC .............. H01J 37/321; H01J 37/32082; H01J 37/32174; H01J 37/32183; H01J 37/32935; H01J 37/3299; H01J 37/32651
USPC ......... 118/723 I; 156/345.24, 345.28, 345.48
See application file for complete search history.

(56) References Cited

U.S. PATENT DOCUMENTS

| | | | |
|---|---|---|---|
| 6,761,963 B2* | 7/2004 | Casper et al. | 428/209 |
| 7,276,816 B2* | 10/2007 | Weiler et al. | 307/104 |
| 7,442,273 B2* | 10/2008 | Kwon et al. | 156/345.48 |
| 7,833,429 B2* | 11/2010 | Nishio et al. | 216/63 |
| 8,062,473 B2* | 11/2011 | Nishio et al. | 156/345.48 |
| 8,597,463 B2* | 12/2013 | Sasaki | 156/345.48 |
| 2003/0205557 A1* | 11/2003 | Benjamin et al. | 216/59 |
| 2004/0173314 A1* | 9/2004 | Nishio et al. | 156/345.33 |
| 2005/0194355 A1* | 9/2005 | Lohokare | H01J 37/321 216/68 |
| 2007/0235135 A1* | 10/2007 | Nishio et al. | 156/345.28 |
| 2008/0011425 A1* | 1/2008 | Nishio et al. | 156/345.48 |
| 2010/0018649 A1* | 1/2010 | Nishio et al. | 156/345.48 |

(Continued)

FOREIGN PATENT DOCUMENTS

| | | |
|---|---|---|
| JP | 2004-235545 A | 8/2004 |
| JP | A-2004-533093 | 10/2004 |

*Primary Examiner* — Benjamin Kendall
(74) *Attorney, Agent, or Firm* — Miles & Stockbridge P.C.

(57) ABSTRACT

In the present invention, there is provided a plasma processing apparatus including a vacuum processing chamber for applying a plasma processing to a sample, a sample stage deployed inside the vacuum processing chamber for mounting the sample thereon, induction antennas provided outside the vacuum processing chamber, a radio-frequency power supply for supplying a radio-frequency power to the induction antennas, and a Faraday shield which is capacitively coupled with the plasma, a radio-frequency voltage being applied to the Faraday shield from the radio-frequency power supply via a matching box, wherein the matching box includes a series LC circuit including a variable capacitor and an inductor, a motor control unit for controlling a motor for the variable capacitor, and a radio-frequency voltage detection unit for detecting the radio-frequency voltage applied to the Faraday shield, the matching box executing a feedback control over the radio-frequency voltage applied to the Faraday shield.

14 Claims, 6 Drawing Sheets

(56) References Cited

U.S. PATENT DOCUMENTS

2011/0108194 A1* 5/2011 Yoshioka et al. ........ 156/345.35
2011/0132540 A1* 6/2011 Sakka et al. ............... 156/345.3
2011/0297320 A1* 12/2011 Sakka et al. ............. 156/345.48

* cited by examiner

PLASMA PROCESSING APPARATUS

BACKGROUND OF THE INVENTION

The present invention relates to a plasma processing apparatus. More particularly, it relates to a plasma processing apparatus which is preferable for performing a surface processing of a sample such as semiconductor element with the use of the plasma.

As one of the conventional plasma processing apparatuses, there exists an inductively-coupled plasma processing apparatus. In this inductively-coupled plasma processing apparatus, a radio-frequency power supply is connected to coil-shaped induction antennas which are provided along the outside of a vacuum chamber and the radio-frequency power is supplied to the induction antennas to generate the plasma. In the plasma processing apparatus which uses induction antennas like this, the coupling between the induction antennas and the plasma generated inside the vacuum chamber changes by reaction products which adhere to the inside of the processing chamber. Then, this change in the coupling gives rise to a problem of the occurrence of time-elapsed changes in such factors as etching rate, its uniformity, verticality of the etching profile, and adherence situation of the reaction products onto the etching side wall. In JP-A-2004-235545, the following method has been disclosed as a method for solving this problem. Namely, a Faraday shield, which is capacitively coupled with the plasma, is set up between the plasma and the induction antennas provided along the outside of the vacuum chamber and a radio-frequency voltage is applied to the shield. The application of this radio-frequency voltage generates a self-bias voltage on the inner wall of the vacuum chamber and an electric field existing inside the sheath draws in the ions existing within the plasma, thereby causing a sputtering on the surface of the vacuum chamber inner wall. Taking advantage of this sputtering makes it possible to suppress or remove deposition of the reaction products, thereby allowing implementation of the cleaning of the vacuum chamber inner wall. A method for controlling the radio-frequency voltage applied to the Faraday shield (i.e., the Faraday Shield Voltage, which, hereinafter, will be referred to as "FSV") is as follows, for example. While the plasma processing of the sample is underway, the FSV is applied with such an extent as to be able to suppress the adherence of the reaction products onto the vacuum chamber inner wall. Meanwhile, at the time of the cleaning of the vacuum chamber inner wall, the radio-frequency voltage is applied which is higher than the FSV applied during the plasma processing of the sample, thereby removing the reaction products adhering onto the vacuum chamber inner wall. In order to set the above-described FSV at the set FSVs, the following control has been executed. Namely, the correlation between the FSV and the capacitance of a variable capacitor is accumulated in advance into a database. Next, the capacitance of the variable capacitor corresponding to the set FSVs is determined by making reference to the database. Then, the capacitance of the variable capacitor is made equal to the capacitance determined for the variable capacitor in the manner described above.

SUMMARY OF THE INVENTION

Nevertheless, because of variations in the capacitance of the variable capacitor and the inductance of a coil included in a series LC circuit, it is required to acquire and manage data for each plasma processing apparatus or for each replacement unit such as an automatic matching box, which includes the built-in variable capacitor and coil. Also, in accompaniment with the progress of the plasma processing of the sample, the plasma impedance changes due to, for example, an influence exerted by an outgas ejected from the reaction products deposited on the vacuum chamber inner wall even when the electrostatic capacitance of the variable capacitor is controlled to be constant. Furthermore, this change in the plasma impedance prevents the radio-frequency voltage, which is to be applied to the Faraday shield, from being controlled to be constant. In view of this situation, the present invention provides a plasma processing apparatus which allows the radio-frequency voltage applied to Faraday shield to be controlled in a stable manner and with a high accuracy.

In the present invention, there is provided a plasma processing apparatus including a vacuum processing chamber for applying a plasma processing to a sample, a sample stage deployed inside the vacuum processing chamber for mounting the sample thereon, induction antennas provided outside the vacuum processing chamber, a radio-frequency power supply for supplying a radio-frequency power to the induction antennas, and a Faraday shield which is capacitively coupled with the plasma, a radio-frequency voltage being applied to the Faraday shield from the radio-frequency power supply via a matching box, wherein the matching box includes a series LC circuit including a variable capacitor and an inductor, a motor control unit for controlling a motor for the variable capacitor, and a radio-frequency voltage detection unit for detecting the radio-frequency voltage applied to the Faraday shield, the matching box executing a feedback control over the radio-frequency voltage applied to the Faraday shield.

According to the present invention, it becomes possible to control the radio-frequency voltage, which is to be applied to the Faraday shield, in a stable manner and with a high accuracy.

Other objects, features and advantages of the invention will become apparent from the following description of the embodiments of the invention taken in conjunction with the accompanying drawings.

DESCRIPTION OF THE EMBODIMENTS

Figure 1:
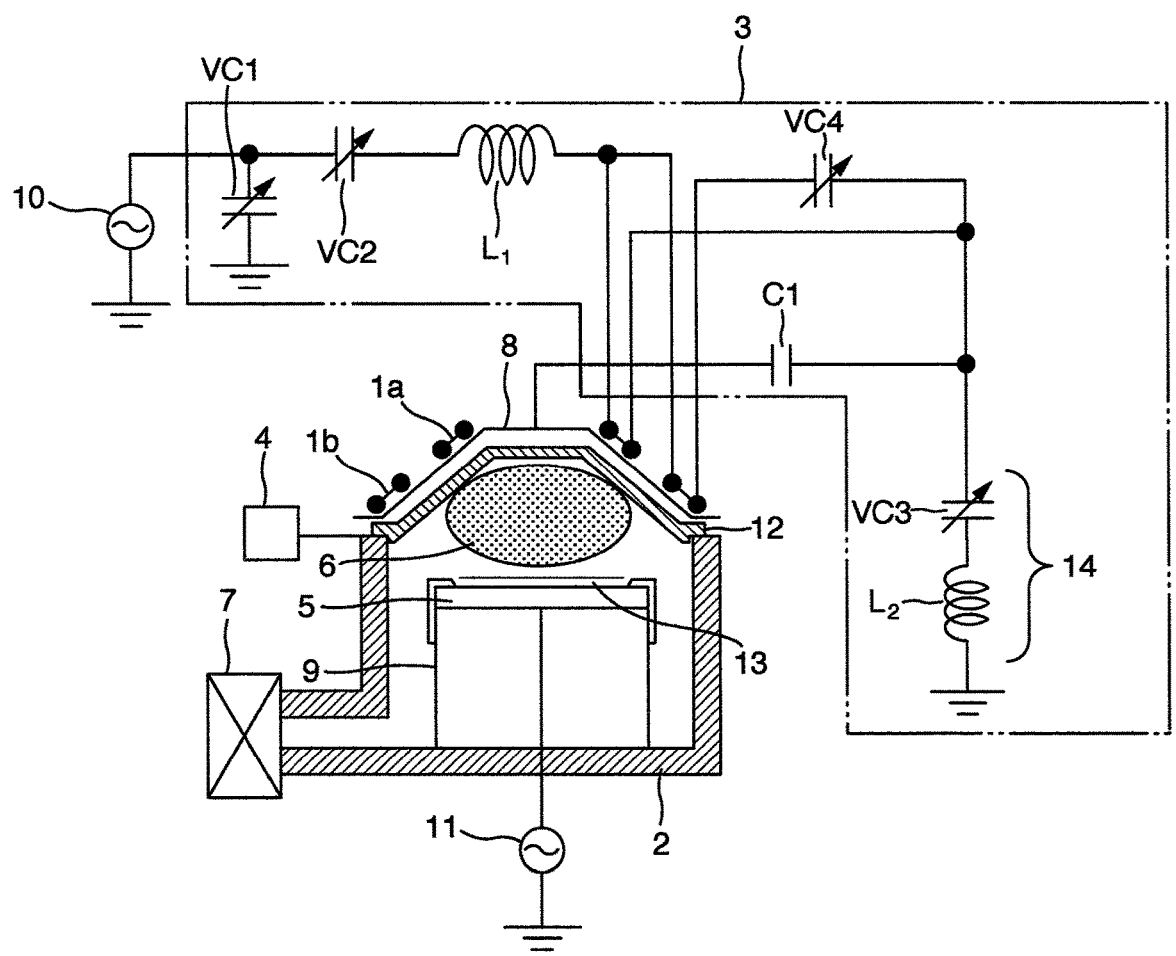
FIG. 1 is a cross-sectional diagram for illustrating an inductively-coupled plasma etching apparatus according to an embodiment of the present invention.

Hereinafter, referring to the drawings, the explanation will be given below concerning embodiments of the present invention.

FIG. 1 is a cross-sectional diagram for illustrating an inductively-coupled plasma etching apparatus where the present invention is used. A cylindrical vacuum processing chamber 2 is equipped with a conical window 12 made of an insulating material, which encloses the upper portion of the vacuum processing chamber 2. A sample stage 5 for mounting a sample 13 thereon is deployed inside the vacuum processing chamber 2. A plasma 6 is generated inside the vacuum processing chamber 2, thereby making it possible to apply the plasma processing to the sample 13. Also, the sample stage 5 is formed on a sample-holding unit 9 including the sample stage 5. A process gas is supplied into the vacuum processing chamber 2 from a gas-supplying device 4. The process gas supplied into the vacuum processing chamber 2 is decompressed and exhausted to maintain a predetermined pressure by an exhaust device 7. The supplied process gas is caused to generate the plasma 6 by the application of an electromagnetic field which is generated from coil-shaped induction antennas 1a and 1b and a Faraday shield 8. In order to allow the ions existing within the plasma 6 to be drawn into the sample 13, a second radio-frequency power supply 11 is connected to the sample stage 5 to apply the radio-frequency power to the sample stage 5.

Figure 2:
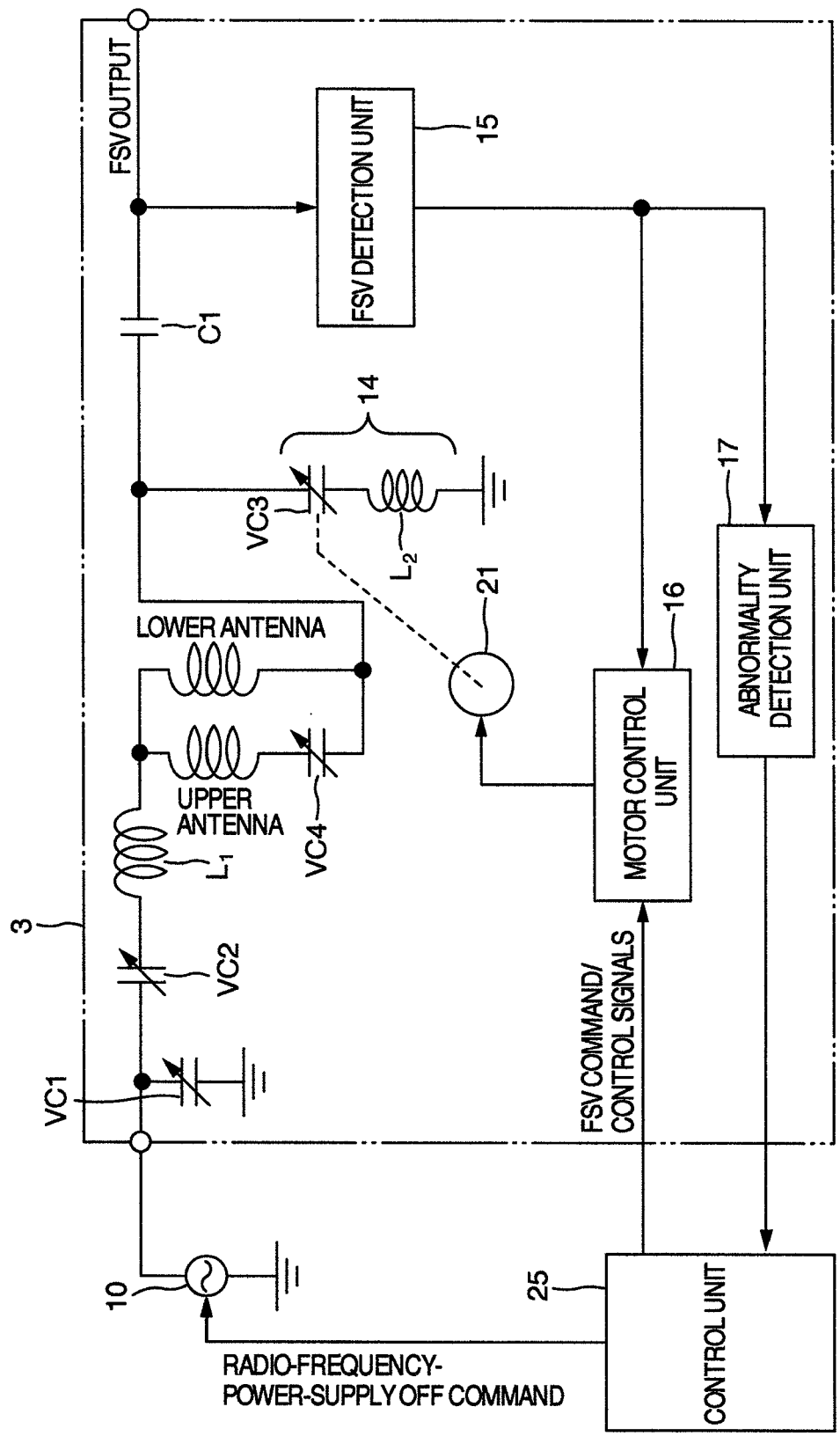
FIG. 2 is a block diagram for illustrating the FSV control of the present invention.
Figure 3:
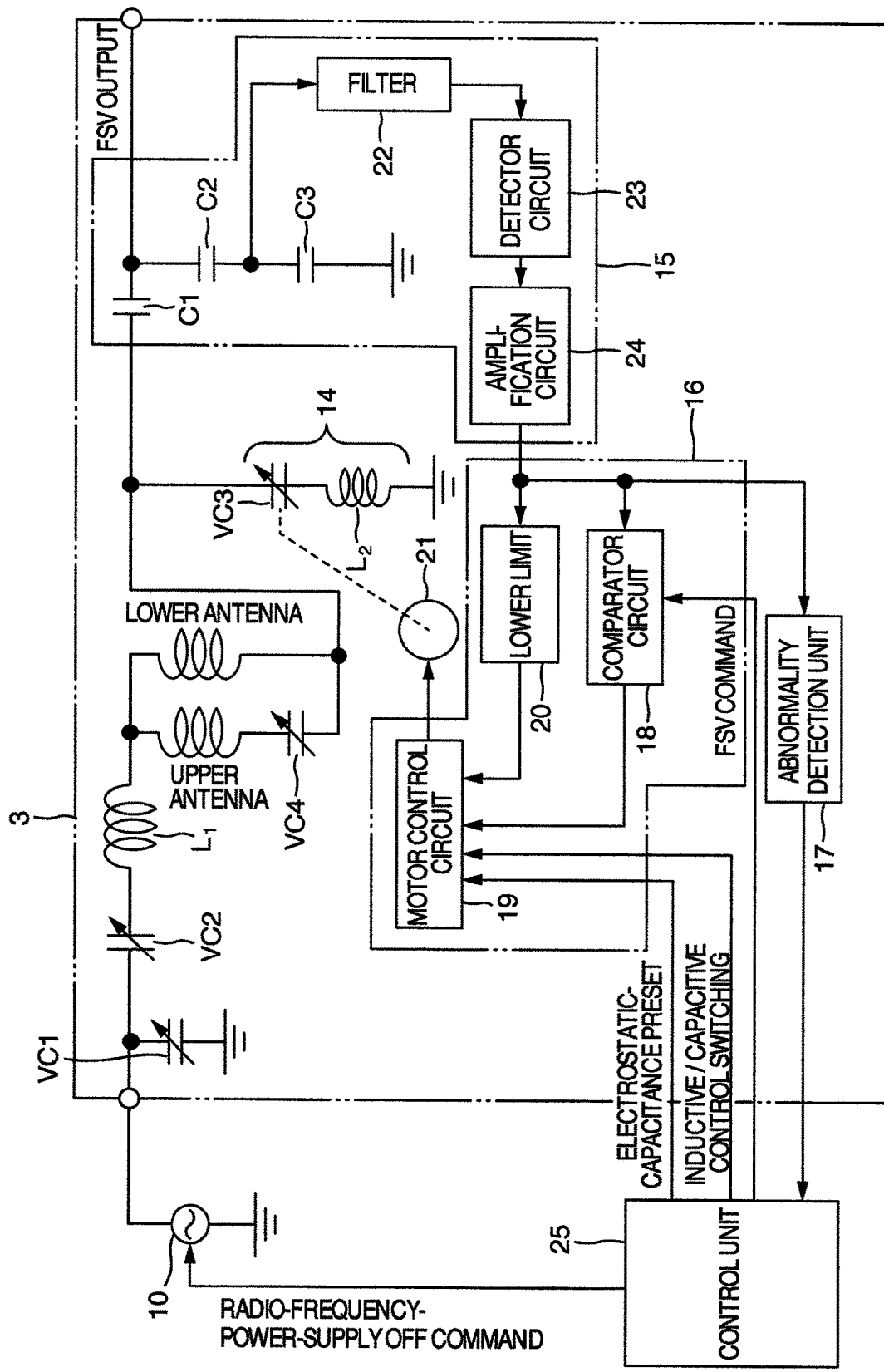
FIG. 3 is a configuration diagram for illustrating a FSV control circuit of the present invention.

The coil-shaped induction antennas are deployed outside the window 12. The induction antennas are divided into the two routes, i.e., the two-turn upper antenna 1a and the two-turn lower antenna 1b. A radio-frequency power (such as, e.g., 13. 56-MHz power, 27. 12-MHz power, or 2-MHz power), which is generated by a first radio-frequency power supply 10, is supplied to the induction antennas to obtain the electromagnetic field for generating the plasma 6. At this time, the impedances of the upper antenna 1a and the lower antenna 1b are matched with the output impedance of the first radio-frequency power supply 10 using a matching circuit which includes variable capacitors VC1 and VC2. Moreover, radio-frequency currents to be supplied to the upper antenna 1a and the lower antenna 1b are controlled using a variable capacitor VC4 which is installed in a matching box 3. The Faraday shield 8, which is capacitively coupled with the plasma 6, is provided between the induction antennas and the plasma 6. A radio-frequency voltage applied to the Faraday shield 8 (i.e., the Faraday Shield Voltage, which, hereinafter, will be referred to as "FSV") from the first radio-frequency power supply 10 via the matching box 3 is controlled by a series LC circuit 14, which includes a variable capacitor (VC3) and a coil ($L_2$) that are installed in the matching box 3. Next, referring to FIGS. 2 and 3, the explanation will be given below concerning the configuration of the FSV automatic control. Here, FIG. 2 illustrates a FSV control block, and FIG. 3 illustrates the configuration of a FSV control circuit, i.e., the detailed configuration of the FSV control block in FIG. 2. In order to perform the FSV automatic control, the matching box 3 includes a motor control unit 16, a FSV detection unit 15, (i.e., a radio-frequency voltage detection unit,) and an abnormality detection unit 17. The motor control unit 16 includes a comparator circuit 18, a motor control circuit 19, and a lower limit 20. The motor control unit 16 performs a feedback control so that the FSV output becomes equal to a FSV command value based on a FSV command signal, an electrostatic-capacitance preset signal, and an inductive/capacitive control switching signal transmitted from a control unit 25, in addition to a signal transmitted from the FSV detection unit 15. The FSV detection unit 15, which includes a filter circuit 22, a detector circuit 23, and an amplification circuit 24, detects the FSV output value. The abnormality detection unit 17, which includes a FSV-overvoltage detection circuit, detects the FSV overvoltage which may lead to a failure of the inductively-coupled plasma etching apparatus.

Next, the explanation will be given below regarding the processing flow for the FSV automatic control. Based on the inductive/capacitive control switching signal for the series LC circuit 14 transmitted from the control unit 25, the motor control circuit 19 inside the matching box 3 is switched into an inductive-property region or a capacitive-property region. Here, the inductive/capacitive control switching signal is set before the output from the first radio-frequency power supply 10 is started. Also, based on the electrostatic-capacitance preset signal, the electrostatic capacitance of the variable capacitor VC3 is set in advance so that the electrostatic capacitance falls into the region that is wished to be controlled. Incidentally, selection between inductive property region and capacitive property region may be set in a group of plasma-processing-condition parameters which is referred to as "recipe" and the above-described inductive/capacitive control switching signal may be transmitted from the control unit 25. Similarly, a preset value of the variable capacitor VC3 may also be set in the group of plasma-processing-condition parameters which is referred to as "recipe" and the electrostatic-capacitance preset signal for the variable capacitor VC3 may also be transmitted from the control unit 25. Next, the FSV output is reduced down to a ratio of about 1/250 relative to the ground potential by a voltage divider made of capacitors C2 and C3. After that, the reduced FSV output is passing through the filter circuit 22 for eliminating its harmonics component and converted into a DC voltage by the detector circuit 23. Moreover, the DC voltage is amplified by the amplification circuit 24, then being detected as a FSV detection value.

Next, in the comparator circuit 18, the comparison is made between the FSV detection value, which has been amplified up to a voltage appropriate for the comparison with the FSV command value, and the FSV command value transmitted from the control unit 25. Based on an error which has obtained as a result of the comparison and a method for controlling each of the capacitive-property region and the inductive-property region, which is selected in advance, a motor 21 for the variable capacitor VC3 is driven by the motor control circuit 19, thereby feedback-controlling the electrostatic capacitance of the variable capacitor VC3. This feedback control is performed until the error between the FSV command voltage and the FSV output value becomes equal to or less than a certain tolerable value. The above-described feedback control over the electrostatic capacitance of the variable capacitor VC3 differs in each capacitive-property or inductive-property region.

In view of this situation, a circuit is provided in the motor control circuit 19, which switches the control direction of the variable capacitor VC3 with a resonant point of the series LC circuit 14 as its switching boundary based on the inductive/capacitive control switching signal. As a result, the radio-frequency voltage to be applied to the Faraday shield 8 can be controlled while each of the capacitive-property region and the inductive-property region is being used in a separate and independent manner in accordance with the inductive/capacitive control switching signal transmitted from the control unit 25.

Figure 4:
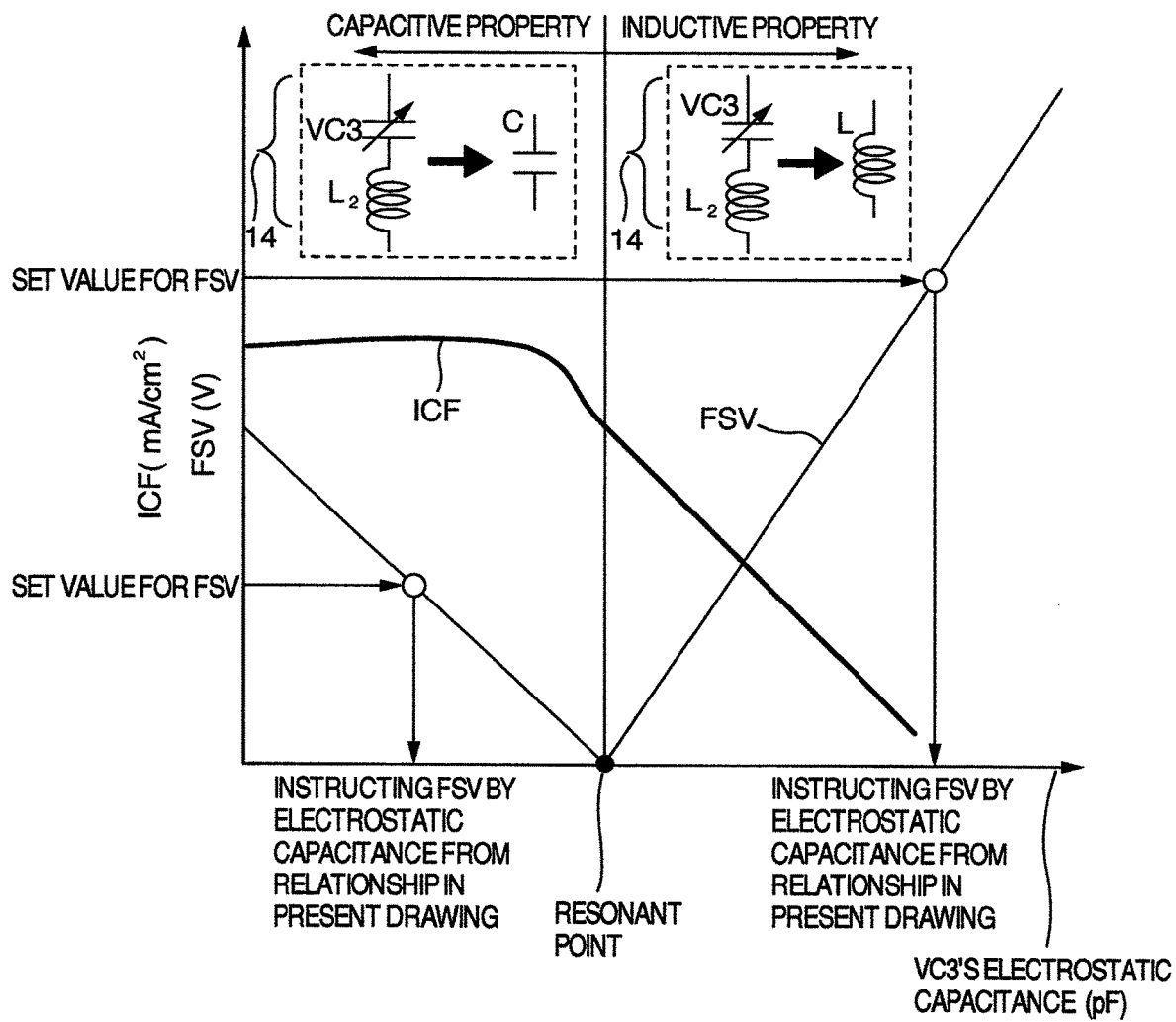
FIG. 4 is a correlation diagram for illustrating the relationship between the FSV and a variable capacitor VC3.

As illustrated in FIG. 4, the ion current flux of the plasma 6 exhibits the following tendency in accompaniment with an increase in the electrostatic capacitance of the variable capacitor VC3. Namely, when the series LC circuit 14 is of the capacitive property, the ion current flux is high, and scarcely changes. Meanwhile, when the series LC circuit 14 is of the inductive property, the ion current flux decreases. In the present invention, as described earlier, each of the capacitive-property region and the inductive-property region can be used in the separate and independent manner. This feature allows the plasma etching processing or plasma cleaning processing to be performed while selecting the above-described ion-current-flux characteristics depending on the requirements then. Also, for example, the following way of using each of the regions may be performed. Namely, in the plasma etching processing, a change in the radio-frequency voltage of the FSV during the plasma-etching-processing time is suppressed down to the lowest possible degree, thereby suppressing its influence onto the plasma-etching performance. This suppression is performed by controlling the FSV in the capacitive-property region, where the gradient of the change in the FSV due to the change in the electrostatic capacitance is small. Meanwhile, in the plasma cleaning processing, the effect of the plasma cleaning is enhanced by controlling the FSV in the inductive-property region, where the absolute value of the radio-frequency voltage of the FSV is large.

Figure 5:
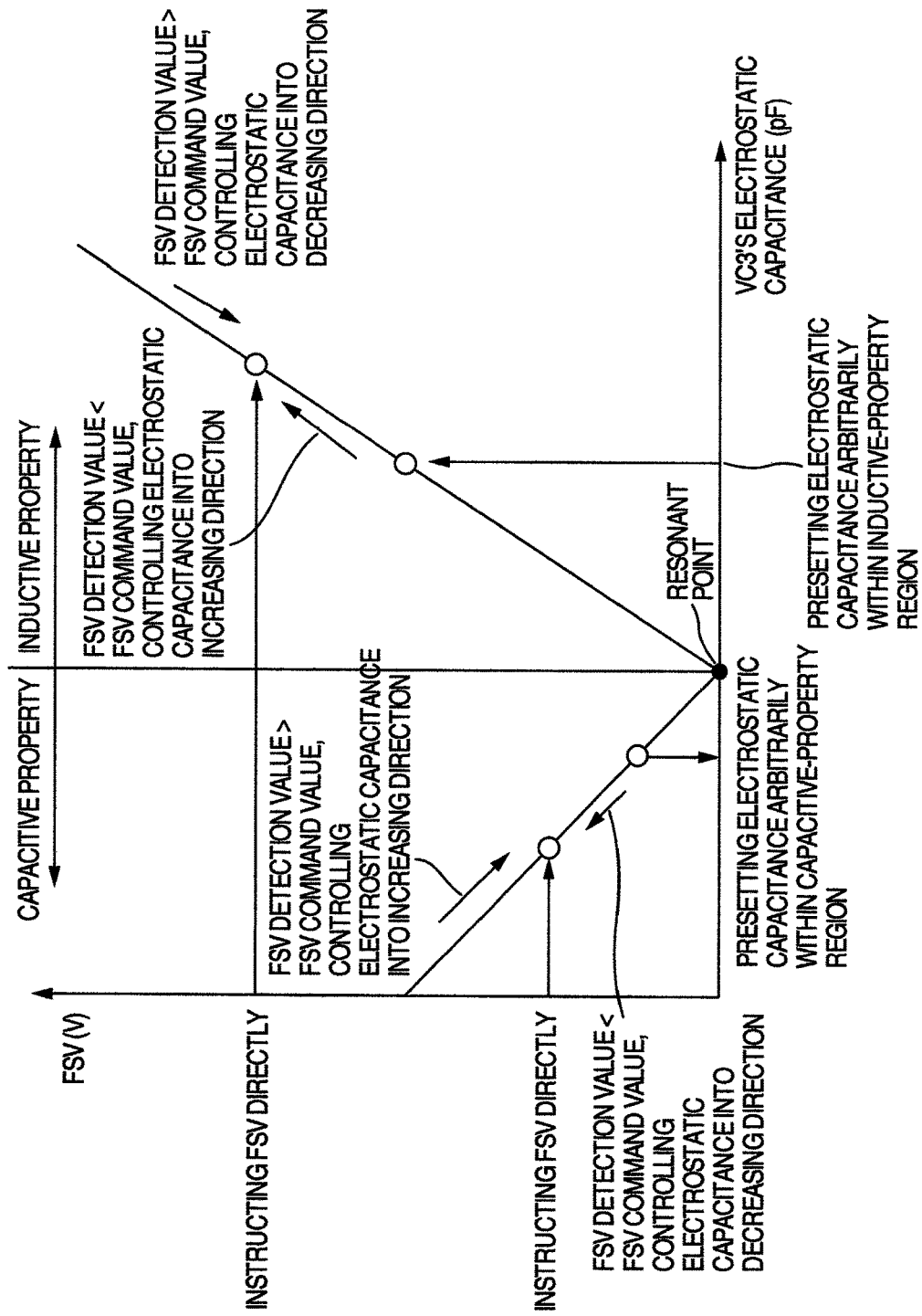
FIG. 5 is a conceptual diagram for illustrating the FSV control method of the present invention.

Next, referring to FIG. 5, the explanation will be given below concerning the method for controlling the electrostatic capacitance of the variable capacitor VC3 in each of the capacitive-property region and the inductive-property region. When controlling the FSV in the capacitive-property region in accordance with the inductive/capacitive control switching signal, if the FSV detection value is smaller than the FSV command value, the motor 21 for the variable capacitor VC3 is rotated in a direction of giving rise to a decrease in the electrostatic capacitance of the variable capacitor VC3. Meanwhile, if the FSV detection value is larger than the FSV command value, the motor 21 for the variable capacitor VC3 is rotated in a direction of giving rise to an increase in the electrostatic capacitance of the variable capacitor VC3. In this way, the feedback control is performed so that the difference between the FSV detection value and the FSV command value falls within a tolerable range. Conversely, when controlling the FSV in the inductive-property region, if the FSV detection value is smaller than the FSV command value, the motor 21 for the variable capacitor VC3 is rotated in a direction of giving rise to an increase in the electrostatic capacitance of the variable capacitor VC3. Meanwhile, if the FSV detection value is larger than the FSV command value, the motor 21 for the variable capacitor VC3 is rotated in a direction of giving rise to a decrease in the electrostatic capacitance of the variable capacitor VC3. In this way, the feedback control is performed so that the difference between the FSV detection value and the FSV command value falls within a tolerable range.

The above-described configuration of the present invention allows the FSV to be controlled in a constant manner, whether the series LC circuit 14 is of the capacitive property or of the inductive property. This feature makes it possible to tremendously shorten a time which is needed for collecting the data on the relationship between the FSV and the electrostatic capacitance. Also, it becomes possible to suppress the change in the FSV caused by a lapse of the plasma-etching-processing time. This feature allows implementation of a reduction in the influence of the change of the FSV onto the plasma-etching performance and implementation of the execution of the high-reproducibility plasma cleaning.

Also, the object of the present invention is to execute the FSV control while each of the capacitive-property region and the inductive-property region is being used in the separate and independent manner. In proximity to the resonant point, however, it is possible that a steep change in the plasma may convert the control range from the capacitive property to the inductive property, or from the inductive property to the capacitive property over the resonant point while the electrostatic capacitance of the variable capacitor VC3 is changed. In this case, it turns out that the control logic for the FSV is inverted and the feedback control becomes unattainable. This would cause the FSV overvoltage and, accordingly, there exists a danger which may lead to a failure of the inductively-coupled plasma etching apparatus.

Figure 6:
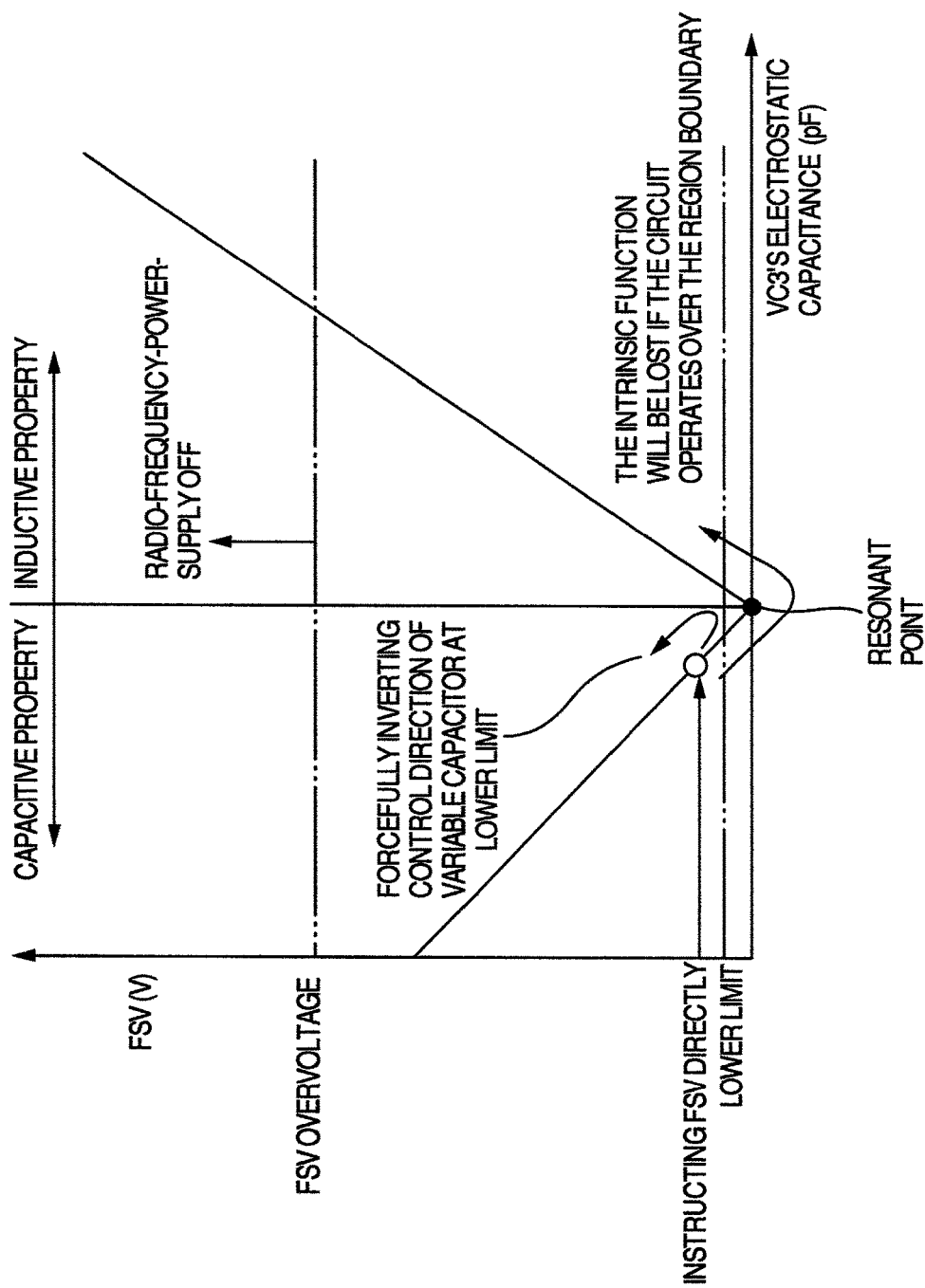
FIG. 6 is a conceptual diagram for illustrating a lower limit and an overvoltage-detecting function.

In view of this situation, in the present invention, the lower limit 20 is provided as is illustrated in FIG. 6. Then, a control is executed which will forcefully invert the control direction of the variable capacitor VC3 if the FSV becomes smaller than the lower-limit voltage value set in advance. This control is executed in order that the control range is not converted from the capacitive property to the inductive property, or from the inductive property to the capacitive property. Incidentally, in the present embodiment, the setting of the lower limit 20 has been given using the analog circuit. This setting, however, may also be given based on the plasma processing conditions.

Also, in order to protect the inductively-coupled plasma etching apparatus, there is provided the FSV-overvoltage detection circuit, which is the circuit for detecting that the FSV has exceeded its upper limit. Consequently, there is also provided a function of turning off the output from the first radio-frequency power supply 10 when the FSV overvoltage is detected by the FSV-overvoltage detection circuit. Although, in the present embodiment, the FSV detection signal is a digital signal, the FSV-overvoltage detection may also be performed by directly fetching the FSV detection signal in its analog form.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A plasma processing apparatus, comprising:
   a vacuum processing chamber in which a sample is processed using plasma;
   a sample stage, disposed inside said vacuum processing chamber, for mounting said sample thereon;
   induction antennas disposed outside said vacuum processing chamber;
   a radio-frequency power supply for supplying a radio-frequency power to said induction antennas;
   a Faraday shield capacitively coupled with said plasma;
   a control unit; and
   a matching box, coupled to said radio-frequency power supply and said control unit, configured to provide a radio-frequency voltage to said Faraday shield, the matching box including:
      a series LC circuit, including a variable capacitor and an inductor, for controlling said radio-frequency voltage provided to said Faraday shield by controlling a capacitance of said variable capacitor, the series LC circuit having a resonant point with a resonant capacitance;
      a radio-frequency voltage detection unit for detecting said radio-frequency voltage provided to said Faraday shield, and
      a motor control circuit configured to:
         receive, from the control unit, a control signal and a preset value for the variable capacitor, control the capacitance of said variable capacitor based on the control signal, a prescribed radio-frequency voltage, and said detected radio-frequency voltage such that a difference between said prescribed radio-frequency voltage and said detected radio-frequency voltage is smaller than a predetermined value, said control signal determining whether said series LC circuit operates in a first control range of said variable capacitor or a second control range of said variable capacitor, the first control range having lower capacitance than the resonant capacitance of the series LC circuit, and the second control range having higher capacitance than the resonant capacitance of the series LC circuit, and increase said capacitance of said variable capacitor when said control signal is set for first control range operation and said detected radio-frequency voltage is larger than said prescribed radio frequency voltage.

2. The plasma processing apparatus according to claim 1, wherein said motor control circuit is further configured to decrease said capacitance of said variable capacitor when said control signal is set for first control range operation and said detected radio-frequency voltage is smaller than said prescribed radio frequency voltage.

3. The plasma processing apparatus according to claim 1, wherein said motor control circuit is further configured to reverse a direction of control of said capacitance of said variable capacitor when said detected radio-frequency voltage is lower than a lower limit that is preset such that said first control range of said variable capacitor is not converted to said second control range or said second control range of said variable capacitor is not converted to said first control range.

4. The plasma processing apparatus according to claim 1, wherein said motor control circuit is further configured to decrease said capacitance of said variable capacitor when said control signal is set for second control range operation and said detected radio-frequency voltage is larger than said prescribed radio-frequency voltage.

5. The plasma processing apparatus according to claim 4, wherein said motor control circuit is further configured to increase said capacitance of said variable capacitor when said control signal is set for second control range operation and said detected radio-frequency voltage is smaller than said prescribed radio-frequency voltage.

6. The plasma processing apparatus according to claim 4, wherein said motor control circuit is further configured to reverse a direction of control of said capacitance of said variable capacitor when said detected radio-frequency voltage is lower than a lower limit that is preset such that said first control range of said variable capacitor is not converted to said second control range or said second control range of said variable capacitor is not converted to said first control range.

7. The plasma processing apparatus according to claim 1, wherein a change of radio-frequency voltage relative to the capacitance of said variable capacitor in said first control range is smaller than a change of radio-frequency voltage relative to the capacitance of said variable capacitor in said second control range.

8. The plasma processing apparatus according to claim 1, wherein an ion current flux of the plasma in said first control range is larger than an ion current flux of the plasma in said second control range.

9. The plasma processing apparatus according to claim 7, wherein an ion current flux of the plasma in said first control range is larger than an ion current flux of the plasma in said second control range.

10. The plasma processing apparatus according to claim 1, further comprising:
a lower limit analog circuit that transmits the preset value to the motor control circuit, wherein the preset value prevents conversion of said first control range of said variable capacitor to said second control range or said second control range of said variable capacitor to said first control range.

11. The plasma processing apparatus according to claim 10, wherein said motor control circuit is further configured to reverse a direction of control of said capacitance of said variable capacitor when said radio-frequency voltage is lower than the preset value.

12. A plasma processing apparatus, comprising:
a vacuum processing chamber in which a sample is processed using plasma;
a sample stage, disposed inside said vacuum processing chamber, for mounting said sample thereon;
induction antennas disposed outside said vacuum processing chamber;
a radio-frequency power supply for supplying a radio-frequency power to said induction antennas;
a Faraday shield capacitively coupled with said plasma;
a control unit; and
a matching box, coupled to said radio-frequency power supply and said control unit, configured to provide a radio-frequency voltage to said Faraday shield, the matching box including:
a series LC circuit, including a variable capacitor and an inductor, for controlling said radio-frequency voltage provided to said Faraday shield by controlling a capacitance of said variable capacitor, the series LC circuit having a resonant point with a resonant capacitance;
a radio-frequency voltage detection unit for detecting said radio-frequency voltage provided to said Faraday shield; and
a motor control circuit configured to:
receive, from the control unit, a control signal and a preset value for the variable capacitor,
control the capacitance of said variable capacitor based on the control signal, a prescribed radio-frequency voltage, and said detected radio-frequency voltage such that a difference between prescribed radio-frequency voltage and detected radio-frequency voltage is smaller than a predetermined value, said control signal determining whether said series LC circuit operates in a first control range of said variable capacitor, or in a second control range of said variable capacitor, the first control range having lower capacitance than the resonant capacitance of the series LC circuit, and the second control range having higher capacitance than the resonant capacitance of the series LC circuit, and
decrease said capacitance of said variable capacitor when said control signal is set for first control range operation and said detected radio-frequency voltage is smaller than said prescribed radio-frequency voltage.

13. A plasma processing apparatus, comprising:
a vacuum processing chamber in which a sample is processed using plasma;

a sample stage, disposed inside said vacuum processing chamber, for mounting said sample thereon;

induction antennas disposed outside said vacuum processing chamber;

a radio-frequency power supply for supplying a radio-frequency power to said induction antennas;

a Faraday shield capacitively coupled with said plasma;

a control unit; and a matching box, coupled to said radio-frequency power supply and said control unit, configured to provide a radio-frequency voltage to said Faraday shield, the matching box including:

a series LC circuit, including a variable capacitor and an inductor, for controlling said radio-frequency voltage provided to said Faraday shield by controlling a capacitance of said variable capacitor the series LC circuit having a resonant point with a resonant capacitance;

a radio-frequency voltage detection unit for detecting said radio-frequency voltage provided to said Faraday shield; and a motor control circuit configured to:
receive, from the control unit, a control signal and a preset value for the variable capacitor,
control the capacitance of said variable capacitor based on the control signal, a prescribed radio-frequency voltage, and said detected radio-frequency voltage such that a difference between prescribed radio-frequency voltage and detected radio-frequency voltage is smaller than a predetermined value, said control signal determining whether said series LC circuit operates in a first control range of said variable capacitor, or in a second control range of said variable capacitor, the first control range having lower capacitance than the resonant capacitance of the series LC circuit, and the second control range having higher capacitance than the resonant capacitance of the series LC circuit, and
decrease said capacitance of said variable capacitor when said control signal is set for second control range operation and said detected radio-frequency voltage is larger than said prescribed radio-frequency voltage.

14. A plasma processing apparatus, comprising:
a vacuum processing chamber in which a sample is processed using plasma;
a sample stage, disposed inside said vacuum processing chamber, for mounting said sample thereon;

induction antennas disposed outside said vacuum processing chamber;

a radio-frequency power supply for supplying a radio-frequency power to said induction antennas;

a Faraday shield capacitively coupled with said plasma;

a control unit; and a matching box, coupled to said radio-frequency power supply and said control unit, configured to provide a radio-frequency voltage to said Faraday shield, the matching box including:

a series LC circuit, including a variable capacitor and an inductor, for controlling said radio-frequency voltage provided to said Faraday shield by controlling a capacitance of said variable capacitor, the series LC circuit having a resonant point with a resonant capacitance;

a radio-frequency voltage detection unit for detecting said radio-frequency voltage provided to said Faraday shield; and a motor control circuit configured to:
receive, from the control unit, a control signal and a preset value for the variable capacitor,
control the capacitance of said variable capacitor based on the control signal, a prescribed radio-frequency voltage, and said detected radio-frequency voltage such that a difference between prescribed radio-frequency voltage and detected radio-frequency voltage is smaller than a predetermined value, said control signal determining whether said series LC circuit operates in a first control range of said variable capacitor, or in a second control range of said variable capacitor, the first control range having lower capacitance than the resonant capacitance of the series LC circuit, and the second control range having higher capacitance than the resonant capacitance of the series LC circuit, and
increase said capacitance of said variable capacitor when said control signal is set for second control range operation and said detected radio-frequency voltage is smaller than said prescribed radio-frequency voltage.

* * * * *